United States Patent [19]

Stein

[11] 3,746,934

[45] July 17, 1973

[54] STACK ARRANGEMENT OF SEMICONDUCTOR CHIPS

[75] Inventor: Karl-Ulrich Stein, Munich, Germany

[73] Assignee: Siemens Aktiengesellschaft, Berlin and Munich, Germany

[22] Filed: May 6, 1971

[21] Appl. No.: 140,682

[52] U.S. Cl. ... 317/101 CM, 174/68.5, 174/DIG. 3, 317/101 CE

[51] Int. Cl. .............................................. H05k 1/04

[58] Field of Search.................... 317/101; 174/68.5, 174/DIG. 3

[56] References Cited

UNITED STATES PATENTS

| | | | |
|---|---|---|---|
| 2,872,664 | 2/1959 | Minot | 317/101 CE X |
| 3,234,433 | 2/1966 | Braunagel | 174/68.5 X |
| 3,239,719 | 3/1966 | Shower | 174/68.5 X |
| 3,351,816 | 11/1967 | Sear et al. | 317/101 CM |
| 3,390,308 | 6/1968 | Marley | 174/DIG. 3 |
| 3,398,326 | 8/1968 | Swart et al. | 317/101 CM |
| 3,401,309 | 9/1968 | Shatz | 174/68.5 X |
| 3,403,308 | 9/1968 | Horowitz et al. | 317/101 CM |
| 3,437,882 | 4/1969 | Cayzer | 317/101 CM UX |

FOREIGN PATENTS OR APPLICATIONS

| | | | |
|---|---|---|---|
| 242,157 | 12/1962 | Australia | 317/101 CM |

*Primary Examiner*—J. R. Scott

*Attorney*—Curt M. Avery, Arthur E. Wilfond, Herbert L. Lerner and Daniel J. Tick

[57] ABSTRACT

A stack arrangement of at least two semiconductor bodies, preferably for arranging memory chips in which the individual semiconductor bodies are superimposed without casing and carrier plates. The edges of the semiconductor bodies have electrically conductive wires extending perpendicularly to the planes of the bodies.

3 Claims, 3 Drawing Figures

STACK ARRANGEMENT OF SEMICONDUCTOR CHIPS

DESCRIPTION OF THE INVENTION

The invention relates to a stack arrangement of at least two semiconductor bodies, preferably for arranging memory chips. A method for producing such an arrangement is disclosed.

It is known to arrange semiconductor bodies, such as nonencased semiconductor chips with integrated circuits, in a plane. Only the planes of the semiconductor bodies or planes parallel to such planes are thus available for the installation of the electrical conductors of the circuits, in order to permit mutual crossing of electrical conductor paths, with appropriate through-contacting. The lengths of the conductor paths themselves are partly considerable, since the interconnection of distant contacts of various chips is unavoidable. Furthermore, the number of chips to be used is limited by the technologically determined dimensions of the area of the plane. Conductor paths which are too long cause the occurrence of parasitic capacitances which increase the switching times to a frequently insupportable degree.

It is also known to superimpose the plates with conductors or conductor paths, semiconductor chips, and other circuit components. The conductor paths of each plate are guided up to the edge of the plate and are provided with metallic contact points. After the entire arrangement is fixed, the desired electrical connections are placed between the individual contact points of the conductor paths guided up to the edge of the semiconductor plate. Arrangements of this type are hardly suitable, because of the complicated wiring between individual memories, for the construction of semiconductor memories with memory chips of large capacitance and high operating speeds.

An object of the invention is to provide a stack arrangement of semiconductor bodies with simple and short electrical connections between the individual chips.

Another object of the invention is to provide a stack arrangement of semiconductor bodies in which parasitic capacitances occurring therein are as low as possible.

Still another object of the invention is to provide a stack arrangement of semiconductor bodies which is produced by the simplest possible method.

To accomplish this, and in accordance with the invention, the individual semiconductor bodies are superimposed or stacked upon each other without encasing and carrier plates. Electrical conductors are provided at the edges of the semiconductor bodies and extend perpendicularly to the planes of the semiconductor bodies.

It is particularly favorable if the conductors have low capacities due to their short length. This applies particularly when a plurality of memory chips are interconnected in one arrangement.

Another feature of the invention provides that the edges of the individual semiconductor bodies abut against the tooth-like, free ends of metallic bridges or ledges. The ends opposite the free ends of the bridges are thickened and each two superimposed bridges of the stacked arrangement are electrically interconnected at their thickened ends.

In another embodiment of the invention at least two semiconductor bodies are connected by means of at least two, preferably superimposed, contact surfaces, via a metallic pin which is inserted through a bore formed through the contact surfaces and the semiconductor bodies.

The invention permits a large spatial density of semiconductor chips at small parasitic capacitances, due to its construction method, which is particularly adapted to the arrangement of memories. The signal travel periods, and thus the switching periods of the entire memory system, may be kept very low.

Multilayer wirings with very fine structures in the order of magnitude of 70 micrometers, which are very expensive and difficult to produce, can be avoided. The stack arrangement of individual chips with the electrical connections located along the stacks, offers great advantages for semiconductor memories. Thus, for example, with 16 memory elements for each chip, eight address lines, two leads for the supply voltages and digit conductors pairs, of which each pair is contacted only at one chip, may be guided along the stack.

The invention also relates to a method for producing the stack arrangement of semiconductor chips.

In accordance with the invention, the semiconductor body is electrically and mechanically connected to the tooth-like free ends of the bridges or ledges located at the inside boundary of a metallic frame. The thickness of the metallic frame at its outer boundaries is at least equal to the sum of the thicknesses of the free ends of the bridges and of the semiconductor body. After additional metallic frames are arranged, and after they are cast with an insulating mass, the thickened bridges which are adjacent the outer boundary of the frame are partly separated in such a manner that each two superimposed bridges of the stack arrangement are electrically connected through their remaining thickened parts.

The method makes possible an arrangement of memory chips which is technically easy to produce. The bridges of the metallic frame may be used directly as conductor paths or "beam leads." The metallic frames are so designed that it is possible to stack the semiconductor bodies and to effect the desired electrical connections along the semiconductor bodies.

Another feature of the invention is that each metallic bridge consists of at least two parts. This permits a particularly simple production of the entire arrangement.

Other features and details of the invention may be derived from the following disclosure of two embodiments of the invention. In order that the invention may be readily carried into effect, it will now be described with reference to the accompanying drawings, wherein:

FIG. 4 is a section through another embodiment of the stack arrangement of the invention.

In the FIGS., the same components are identified by the same reference numerals.

Figures 1, 2:
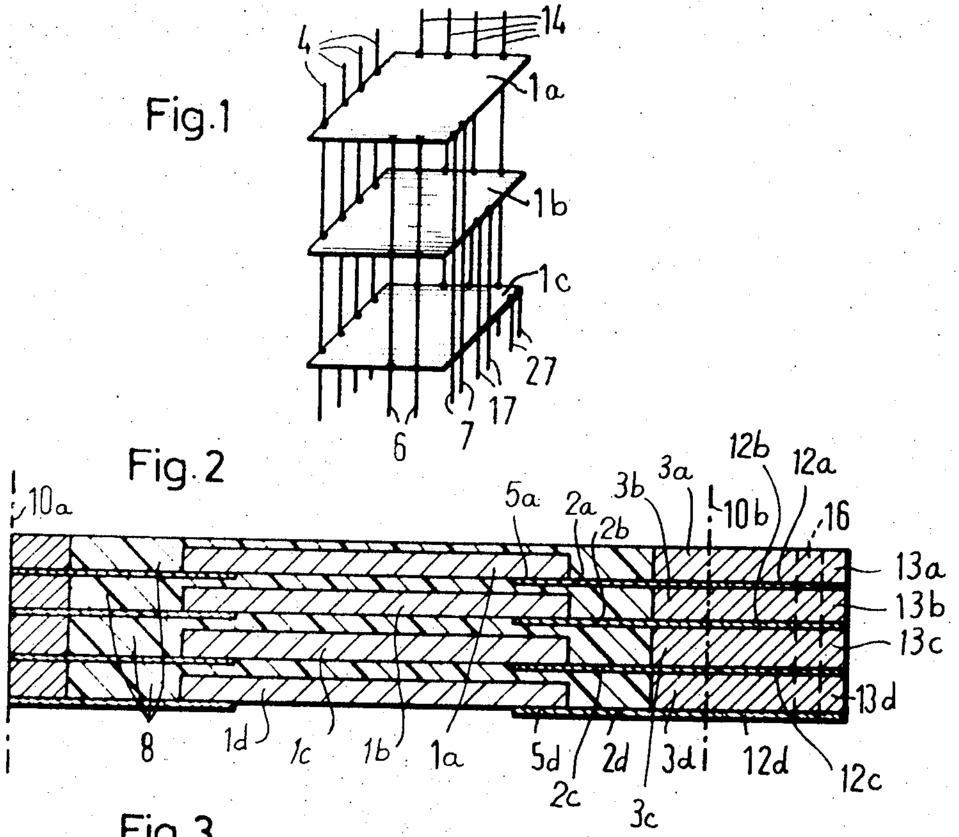
FIG. 1 is a schematic perspective diagram of an embodiment of the stack arrangement of the invention.
FIG. 2 is a section through an embodiment of the stack arrangement of the invention.

FIG. 1 shows three semiconductor bodies *1a*, *1b* and *1c* in a basic diagram. Each of the semiconductor bodies *1a*, *1b* and *1c* is contacted by four address lines 4, four address lines 14 and two supply lines 6. The electrically conductive lines electrically connect the individual semiconductor bodies 1*a*, 1*b* and 1*c* to each other. Furthermore, each semiconductor body 1*a*, 1*b* and 1*c* is connected for itself only to a corresponding one of a plurality of digit conductor pairs 7, 17 and 27. The conductor pair 7 is connected to the semiconductor body 1*a*. The conductor pair 17 is connected to the semiconductor body 1*b*. The conductor pair 27 is connected to the semiconductor body 1*c*. The arrangement of FIG. 1 may be produced by the invention, shown in greater detail in FIGS. 2, 3 and 4.

As shown in FIG. 2, a plurality of semiconductor bodies 1*a*, 1*b*, 1*c* and 1*d* abut or bear upon the free ends, ledges or bridges 2*a*, 2*b*, 2*c* and 2*d* of corresponding thin metallic frames 12*a*, 12*b*, 12*c* and 12*d*. Thus, the semiconductor body 1*a* abuts the bridges 2*a* of the frame 12*a*. The semiconductor body 1*b* abuts the bridges 2*b* of the frame 12*b*. The semiconductor body 1*c* abuts the bridges 2*c* of the frame 12*c*. The semiconductor body 1*d* abuts the bridges 2*d* of the frame 12*d*. The bridges 2*a*, 2*b*, 2*c* and 2*d* extend into the interior of the corresponding frames 12*a*, 12*b*, 12*c* and 12*d* and are electrically connected, via contact surfaces 5*a*, 5*b*, 5*c* and 5*d*, respectively, to the corresponding semiconductor bodies 1*a*, 1*b*, 1*c* and 1*d*.

Each of the frames 12*a*, 12*b*, 12*c* and 12*d* is provided with a corresponding one of another plurality of metallic frames 13*a*, 13*b*, 13*c* and 13*d*, each of which comprises inwardly pointing bridges or ledges 3*a*, 3*b*, 3*c* and 3*d*, respectively, which are shorter than the bridges 2*a*, 2*b*, 2*c* and 2*d* and bear against the same. The frame 12*d* is provided with the frame 13*d*. The frame 12*c* is positioned on the frame 13*d* and is provided with the frame 13*c*. The frame 12*b* is positioned on the frame 13*c* and is provided with the frame 13*b*. The frame 12*a* is positioned on the frame 13*b* and is provided with the frame 13*a*.

Figure 3:
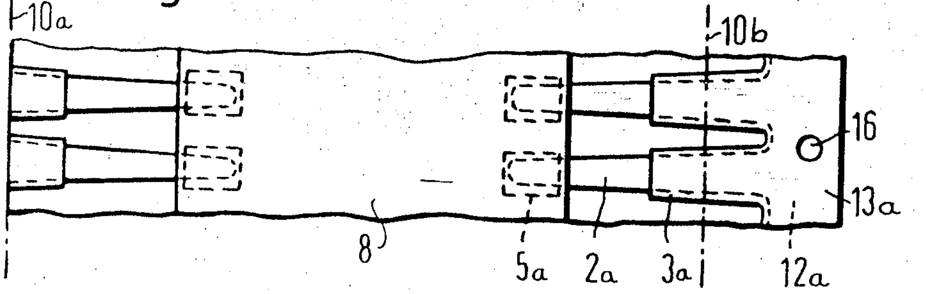
FIG. 3 is a top view of the arrangement of FIG. 2.

According to the method of the invention, after the stack is produced, the outer parts of the frames 12*a* to 12*d* and 13*a* to 13*d* are separated along lines 10*a* and 10*b*, shown in broken lines in FIGS. 2 and 3. Prior to such separation, however, the interior or inside of the stack arrangement is cast or filled with an insulating mass 8 and the bridges or ledges 2*a* to 2*d* and 3*a* to 3*d* are soldered to each other. Epoxide resin may be used as the insulating mass 8. The electrically insulating material 8 permits electrical connections between the superimposed contact surfaces 5*a* to 5*d* of the individual semiconductor bodies 1*a* to 1*d* via the bridges 2*a* to 2*d* and 3*a* to 3*d*, without causing short-circuits with adjacent ones of said contact surfaces 5*a* to 5*d* provided on the same semiconductor bodies.

The outer parts of the frames 12*a* to 12*d* and 13*a* to 13*d* may be removed by milling. The metallic frames 12*a* to 12*d* and 13*a* to 13*d* and their bridges 2*a* to 2*d* and 3*a* to 3*d* may also consist of a single unit or unitary structure. The use of separated frames 12*a* to 12*d* and 13*a* to 13*d* permits a particularly simple construction of the entire stack arrangement, and permits the formation of bores 16 through the frames 12*a* to 12*d* and 13*a* to 13*d* for centering purposes.

Another structural embodiment of the stack arrangement of the invention is illustrated in FIG. 4. In the embodiment of FIG. 4, the individual semiconductor bodies 1*a*, 1*b* and 1*c* have bores formed therethrough at opposite ends thereof at their contact surfaces 5*a*, 5*b* and 5*c* and 5*a'*, 5*b'* and 5*c'*, respectively. A pair of electrically conductive pins 15*a* and 15*b* electrically connect the superimposed contact surfaces 5*a*, 5*b* and 5*c* and 5*a'*, 5*b'* and 5*c'* when they are inserted into the corresponding bores. This permits a stack arrangement of the chips without the use of a frame or frames.

While the invention has been described by means of specific examples and in specific embodiments, I do not wish to be limited thereto, for obvious modifications will occur to those skilled in the art without departing from the spirit and scope of the invention.

I claim:

1. A stock arrangement for semiconductor chips, comprising at least two semiconductor bodies superimposed on each other, at least two metallic bridges superimposed on each other, each metallic bridge having a thickened portion extending substantially perpendicularly to the planes of said semiconductor bodies and being disposed at the outer edges of said semiconductor bodies, said superimposed bridges being electrically and mechanically connected to one another at their thickened portions said metallic bridges each having tooth-like portions extending from said thickened portion generally parallel to said semiconductor bodies, each of said semiconductor bodies having contact surfaces making electrical and mechanical contact with the free end section of a corresponding one of said tooth-like portions.

2. A stack arrangement as claimed in claim 1, wherein each of the metallic bridges comprises two parts.

3. A stack arrangement according to claim 1 wherein said thickened portion of each said bridges has a thickness which is at least equal to the sum of the thicknesses of the free end section of said tooth-like portion and the semiconductor body.

* * * * *